United States Patent
Tada et al.

[11] Patent Number: 5,942,282
[45] Date of Patent: Aug. 24, 1999

[54] METHOD FOR DEPOSITING A TITANIUM FILM

[75] Inventors: Kunihiro Tada, Nirasaki; Yoshihiro Tezuka, Kamifukuoka; Kazuichi Hayashi, Kofu, all of Japan

[73] Assignee: Tokyo Electron Limited, Tokyo, Japan

[21] Appl. No.: 09/071,156

[22] Filed: May 4, 1998

[30] Foreign Application Priority Data

May 20, 1997 [JP] Japan ................................. 9-145855

[51] Int. Cl.⁶ .................................................. C23C 16/06
[52] U.S. Cl. ........................ 427/250; 427/237; 427/239; 427/253; 427/255.7; 438/680
[58] Field of Search .................... 427/576, 237, 427/239, 248.1, 250, 253, 255, 255.2, 255.7; 438/680; 134/1.1

[56] References Cited

U.S. PATENT DOCUMENTS

| | | | |
|---|---|---|---|
| 4,923,715 | 5/1990 | Matsuda et al. | 427/237 |
| 5,482,749 | 1/1996 | Telford et al. | 427/578 |

FOREIGN PATENT DOCUMENTS

| | | |
|---|---|---|
| 63-89672 | 4/1988 | Japan . |
| 3-044469 | 2/1991 | Japan . |
| 6-163427 | 6/1994 | Japan . |
| 6-216222 | 8/1994 | Japan . |
| 7-273053 | 10/1995 | Japan . |

*Primary Examiner*—Timothy Meeks
*Attorney, Agent, or Firm*—Oblon, Spivak, McClelland, Maier & Neustadt, P.C.

[57] ABSTRACT

A first pre-coating film forming gas containing titanium is supplied into a process chamber in which a susceptor for supporting a wafer is located, at the same time heating the susceptor to thereby form, on the susceptor, a first pre-coating film containing titanium as a main component, and then a second pre-coating film forming gas containing titanium and nitrogen is supplied into the process chamber to thereby form, on the pre-coating first film, a second pre-coating film containing titanium nitride as a main component. The wafer is mounted on a part of the second pre-coating film susceptor. A first film forming gas containing titanium is supplied into the process chamber, at the same time heating the susceptor to thereby form, on the wafer, a first film containing titanium as a main component, and then a second film forming gas containing titanium and nitrogen is supplied into the process chamber to thereby form, on the first film on the wafer, a second film containing titanium nitride as a main component.

2 Claims, 3 Drawing Sheets

METHOD FOR DEPOSITING A TITANIUM FILM

BACKGROUND OF THE INVENTION

This invention relates to a film forming method and apparatus for forming a metal-contained film such as a titanium film on a to-be-processed object such as a semiconductor wafer.

In general, to manufacture a semiconductor integrated circuit, a plurality of desired elements and/or wiring are formed on a substrate such as a semiconductor wafer by repeating processes which include film forming and pattern etching processes. Materials with a low electric resistance, of course, and also a high anti-corrosion must be used to form wiring for connecting the elements, a metallic contact for each element, or a metallic barrier for suppressing absorption of Si from the substrate. To this end, there is a tendency to use refractory metals such as Ti (titanium), W (tungsten), or Mo (molybdenum). Among these metals, Ti and TiN (titanium nitride) films are used in many cases since they show excellent electric and anti-corrosion characteristics.

Ti films are formed generally by plasma CVD (Chemical Vapor Deposition) using $TiCl_4$ (titanium tetrachloride) and $H_2$ gases as material gases. On the other hand, TiN films are formed by plasmaless CVD using $TiCl_4$ and $N_2$ gases as material gases, or by plasma CVD in the atmosphere of nitrogen gas.

A susceptor used in a film forming apparatus for performing the above-described film forming is generally made of ceramic such as AlN (aluminum nitride) which shows excellent heat resistance or anti-corrosion. The ceramic susceptor is rather expensive. Further, since ceramic itself has a low electric conductivity, it is possible that a potential difference will occur, during plasma CVD, in the object-mounting surface of the ceramic susceptor, and/or the susceptor itself and, for example, a peripheral wall portion of a process chamber, and hence that plasma of a stable state will not be generated in the process space to cause variations in plasma concentration in the space.

It is considered that occurrence of such a potential difference is suppressed by forming the susceptor of a metal with high conductivity, in order to stabilize plasma. In this case, however, so-called heavy metal contamination will occur in which semiconductor wafers mounted on the susceptor are contaminated by a metal such as iron, nickel, chromium, and manganese contained in the susceptor. Therefore, this method cannot be employed.

Further, it is considered that a ceramic coating layer is strongly attached to the surface of the metallic susceptor beforehand to prevent the heavy metal contamination. However, in this case, the coating layer may come off the susceptor or crack after the film forming is repeated, since the metallic susceptor and the ceramic coating layer have different coefficient of thermal expansion.

In addition, in the case of using ceramic, semiconductor wafers cannot be heated efficiently since ceramic has a low thermal conductivity.

BRIEF SUMMARY OF THE INVENTION

It is the object of the invention to provide a film forming method and apparatus which use a metallic susceptor without any ceramic coating layer but is free from heavy metal contamination.

To attain the object, there is provided a film forming method for forming a metal-contained film on a to-be-processed object which is supported by a metallic susceptor located in a process chamber, comprising the steps of:

coating the susceptor with a pre-coating metal-contained film which contains the same metal as the metal-contained film which is formed on the to-be-processed object;

then mounting the object on a part of the precoating metal-contained film susceptor, and;

forming the metal-contained film on the object mounted on the part of the precoating film.

As specified above, before a metal-contained film is formed on the to-be-processed object, the susceptor is coated with a pre-coating metal-contained film which contains the same metal as the metal-contained film. Accordingly, even when the metal contained in the pre-coating metal-contained film enters the metal-contained film formed on the object, the object is free from heavy metal contamination since the metal in the former film is of the same kind as that in the latter film.

The metal-contained film formed on the object is, for example, a titanium (Ti) film or a titanium nitride (TiN) film. At this time, the pre-coating metal-contained film has a single-layer structure consisting of a titanium film or a titanium nitride film, or a double-layer structure consisting of both the titanium and titanium nitride films. The titanium nitride film is formed by depositing it on the titanium film, or by nitrifying an upper surface portion of the titanium film.

In an another aspect of the present invention there is provided a film forming method comprising:

a) a pre-process step of supplying a first pre-coating film forming gas containing titanium into a process chamber defined in a process chamber in which a susceptor for supporting a to-be-processed object is located, at the same time heating the susceptor to thereby form, on the susceptor exposed to the film forming gas, a first pre-coating film containing titanium as a main component, and then supplying a second pre-coating film forming gas containing titanium and nitrogen into the process chamber to thereby form, on the first pre-coating film, a second pre-coating film containing titanium nitride as a main component;

b) a take-in step of taking the to-be-processed object into the process chamber after the pre-process step (a), and mounting the object on a part of the second pre-coating film susceptor;

c) a film forming step of supplying a first film forming gas containing titanium into the process chamber, at the same time heating the susceptor to thereby form, on the object, a first film containing titanium as a main component, and then supplying a second film forming gas containing titanium and nitrogen into the process chamber to thereby form, on the first film on the object, a second film containing titanium nitride as a main component; and d) a take-out step of taking, out of the process chamber, the object with the first and second films formed thereon.

In further aspect of the present invention these is provided a film forming method comprising, the steps of;

forming a pre-coating film containing a first metal on a surface of the susceptor by a CVD method, the susceptor made of a material including a second metal different from the first metal;

mounting a to-be-processed object on a part of the pre-coated film on the susceptor; and forming a film containing the first metal on the to-be-processed object.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
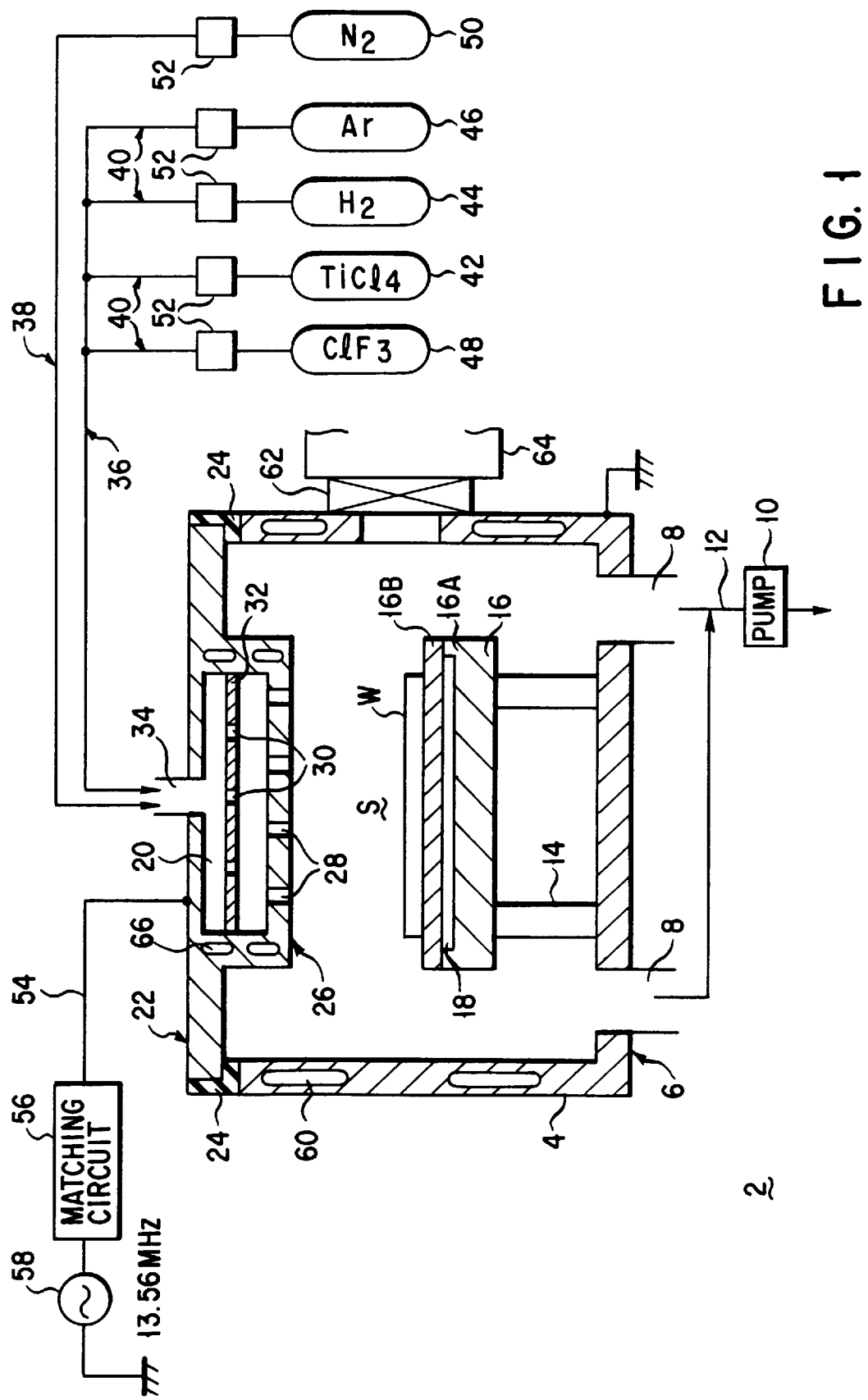
FIG. 1 is a schematic view, showing a film forming apparatus according to one of the embodiments of the invention.

A film forming method and apparatus according to the embodiment of the invention will be described in detail with reference to the accompanying drawings. FIG. 1 is a schematic view, showing the film forming apparatus according to the embodiment of the invention. This embodiment will be explained, taking an example in which a Ti (titanium) film as a metallic film is formed by the film forming apparatus.

As is shown in FIG. 1, a film forming apparatus 2 has a cylindrical, grounded process chamber 4. Vents 8 for discharging the gases in the chamber are formed in a bottom wall 6 of the chamber 4, and connected to an exhaustion system 12 with a vacuum pump 10 for uniformly exhausting the chamber 4 from a bottom portion thereof.

Support rods 14 made of a conductive material stand from the bottom wall in the chamber 4. A disklike susceptor 16 made of a high conductive material such as Hastelloy (trademark) is provided on the upper ends of the support rods 14 for mounting, on its horizontal upper surface, a to-be-processed object such as a semiconductor wafer W. The susceptor 16 which also serves as a lower electrode includes a lower susceptor component 16A directly supported by support rods 14, an upper susceptor component 16B attached to the upper surface of the component 16A, and a resistance heater 18 interposed therebetween. The lower and upper susceptor components 16A and 16B are attached to each other by, for example, welding. The material of the susceptor 16 is not limited to the aforementioned Hastelloy, but may be any metal if it has a anti corrosion characteristic and an electrically a conductivity. For example, stainless steel, nickel, Inconel (trademark), etc. may be used. Further, the lower and upper susceptor components 16A and 16B may be formed of the same material or different materials.

A ceiling plate 22 formed integral with a shower head 20 which also serves as an upper electrode is provided as the ceiling cover of the process chamber 4. More specifically, the ceiling plate 22 is attached to the upper end of the cylindrical wall of the process chamber 4 in an airtight manner, with an insulator 24 interposed therebetween. The shower head 20 has a circular lower surface 26 with a dimension substantially equal to the entire upper surface of the susceptor 16, and is opposed to the susceptor such that a process space S is formed between them.

The shower head 20 is provided for introducing a shower of various gases into the process space, and hence the lower surface 26 has multiple injection holes 28 for injecting the gases into the spaces. A diffusion plate 32 with multiple diffusion holes 30 is provided in the head 20. The gases introduced into the head 20 is diffused by the diffusion holes 30 and then injected through the injection holes 28 into the spaces. A gas introduction port 34 is formed in a center portion of the upper surface of the head 20 for introducing the gases therein. A number (2 in this embodiment) of gas supply passages 36 and 38 are connected to the gas introduction port 34.

A number (4 in this embodiment) of branch lines 40 are connected to the supply passage 36. These branch lines 40 are connected to film-forming-gas supplies. Specifically, the lines 40 are connected to a $TiCl_4$ gas supply 42 which contains $TiCl_4$ gas, an $H_2$ gas supply 44 which contains $H_2$ gas, a plasma gas (Ar gas in this embodiment) supply 46 which contains Ar gas, and a ClF-based gas ($ClF_3$ gas in this embodiment) supply 48 which contains $ClF_3$ gas as a cleaning gas used for the cleaning of the process space, respectively. An $N_2$ gas supply 50 which contains $N_2$ gas as a film forming gas is connected to the other supply passage 38. The flow rate of each gas is controlled by a flow rate controller, e.g. a mass controller 52 provided on a corresponding branch line 40 or the supply passage 38. Although in this embodiment, $TiCl_4$ gas and $N_2$ gas are transferred through different passages and mixed within the shower head 20, this may be modified such that they are mixed before introduced into the shower head 20, or such that they are isolated from each other even within the shower head 20 and mixed after they are injected into the process space S. The same can be said of the other gases $TiCl_4$, $H_2$ and Ar.

A matching circuit 56 and a high frequency power supply 58 of 13.56 MHz for plasma are connected to the ceiling plate 22 via a lead line 54 for generating plasma mainly at the time of forming a Ti film.

A chamber temperature adjusting jacket 60 is provided in the peripheral wall of the process chamber 4, through which a cooled or heated thermal medium is selectively flown, when necessary, in order to adjust the temperature of the peripheral wall and thus the process space. The jacket 60 is connected to a temperature adjuster (not shown). A gate valve 62 is provided at a portion of the peripheral wall of the process chamber such that it can be opened and closed in an airtight manner to enable the wafer W to be transferred between the chamber and a load lock chamber 64. Similarly, a head temperature adjusting jacket 66 is provided in the shower head 20, through which a cooled or heated thermal medium is selectively flown, when necessary, in order to adjust the temperature of the surface of the head. The jacket 66 is connected to a temperature adjuster (not shown).

Referring also to FIGS. 2A–2G, a film forming method employed in the apparatus constructed as above will be described.

In the film forming method according to the embodiment, before the film forming process of the semiconductor wafer W, the entire metallic susceptor is coated with a pre-coating thin film containing a metal, using substantially the same gas or gases as used in the process. Since in this embodiment, a Ti film is formed on the semiconductor wafer W, a thin film which contains Ti metal, such as a Ti thin film or a TiN thin film, or a laminated film consisting of both the thin films is formed as the pre-coating metal-contained thin film. An explanation will be given of the case using the laminated film consisting of both the Ti and TiN thin films.

Figure 2A:
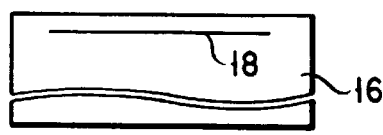
FIGS. 2A–2G are views, showing process steps useful in explaining a film forming method used in the apparatus of FIG. 1.

First, the semiconductor wafer W is not introduced into the process chamber 4 but kept standby in, for example, the load lock chamber 64. At this time, no film is formed on the metallic susceptor 16, and the metal constituting the susceptor is exposed, as is shown in FIG. 2A. In this state, $TiCl_4$ and $H_2$ gases as film forming gases and an Ar gas as a plasma generating gas are introduced at predetermined flow rates into the process chamber 4 through the shower head 20, while the pressure in the chamber 4 is kept at a predetermined level by pulling part of the gases therein using the vacuum pump 10.

Figure 2B:
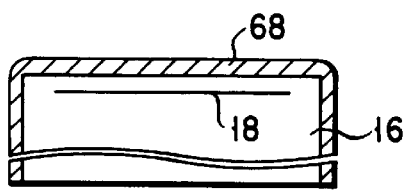

At the same time, a high frequency power of 13.56 MHz is applied from the high frequency power supply 58 to the shower head 20, thereby generating a high frequency electric field in the process space S, i.e. between the shower head 20 as the upper electrode and the susceptor 16 as the lower electrode. As a result, the Ar gas is excited into a plasma state, thereby advancing the reduction between $TiCl_4$ and $H_2$ gases, and forming a Ti thin film 68 on the entire susceptor 16 as shown in FIG. 2B. The film forming is performed under the conditions which enable the Ti film 68 to have a thickness of, for example, 200–300 Å. The Ti film 68 is a first layer of a pre-coating metal-contained thin film which will be described later.

During the formation of the Ti film, the susceptor 16 is kept at a predetermined temperature by the resistance heater 18 buried therein. The peripheral wall of the process chamber 4 and the shower head 20, which will be heated by the plasma, are cooled to a predetermined temperature by flowing a coolant through the chamber temperature adjusting jacket 60 and the head temperature adjusting jacket 66. The process conditions are set such that the temperatures of the susceptor, the chamber peripheral wall, and the shower head 20 are set at, for example, about 700° C., about 130° C. and about 130° C., respectively, the process pressure is set at about 1 Torr, and the high frequency power is set at about 700 W. Further, the flow rates of $TiCl_4$, $H_2$ and Ar gases are set at, for example, 200–300 sccm, 1.5–2 liter/min., and about 1 liter/min., respectively.

Figure 2C:
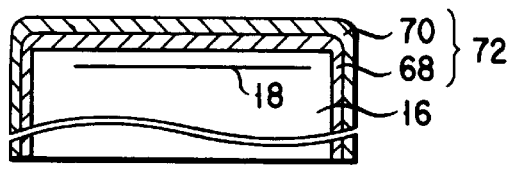
Figure 2D:
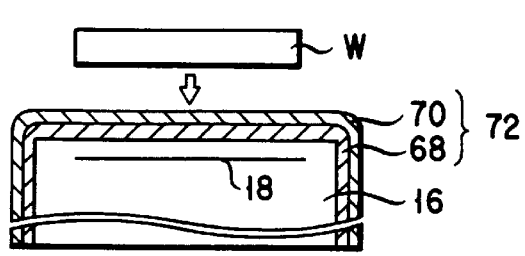

After the first thin layer of the pre-coating metal-contained thin film, i.e. the Ti thin film 68, is formed on the exposed surface of the susceptor, the gases contained in the process chamber 4 are exhausted and a second thin layer of the pre-coating thin film is started to be formed. First, $TiCl_4$ and $N_2$ gases as film forming gases are introduced at predetermined flow rates into the process chamber 4 through the shower head 20, while the pressure in the chamber 4 is kept at a predetermined level by discharging part of the gases therein using the vacuum pump 10. In this case, a TiN thin film 70 is formed by thermal CVD without using a high frequency power, i.e. without plasma, such that it covers the entire upper surface of the Ti thin film 68, as is shown in FIG. 2C.

The film forming is performed under the conditions which enable the TiN thin film 70 to have a thickness of, for example, 200–300 Å. The TiN film 70 is a second layer of a pre-coating metal-contained laminated thin film 72. The process conditions are set such that the temperatures of the susceptor, the chamber peripheral wall, and the shower head 20 are set at, for example, about 700° C., about 130° C. and about 130° C., respectively, the process pressure is set at about 1 Torr. Further, the flow rates of $TiCl_4$ and $N_2$ gases are set at, for example, about 10 sccm and about 50 sccm, respectively.

Figure 2E:
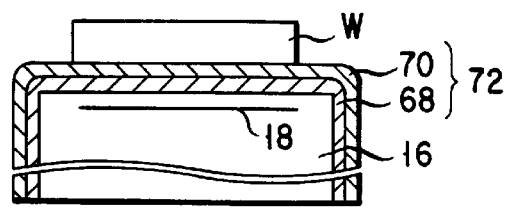
Figure 2F:
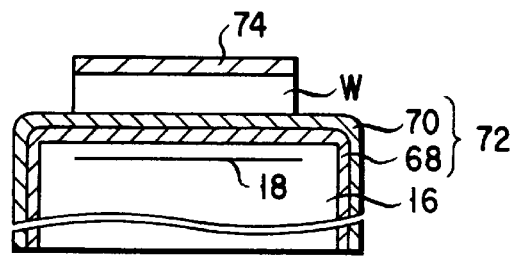

After the pre-coating film 72 of a double-layer structure for preventing heavy metal contamination is formed, film formation is performed on a wafer. First, the gate valve 62 (see FIG. 1) is opened, thereby permitting a wafer W to be transferred into the process chamber 4 (FIG. 2D) through the load lock chamber 64, and to be mounted on the susceptor 16 (FIG. 2E). Subsequently, film formation is started with the process chamber 4 sealed in an airtight manner. First, a Ti film is formed on the wafer using the same film forming gases and under the same conditions as in the case of the formation of the Ti thin film 68 of the pre-coating laminated film 72. Specifically, $TiCl_4$ and $H_2$ gases as film forming gases and an Ar gas as a plasma generating gas are introduced at predetermined flow rates into the process chamber 4 through the shower head 20, while the pressure in the chamber 4 is kept at a predetermined value by discharging part of the gases. A Ti film 74 with a predetermined thickness as a metal-contained film is formed on the wafer W as a result of reduction assisted by plasma, as is shown in FIG. 2F.

Figure 2G:
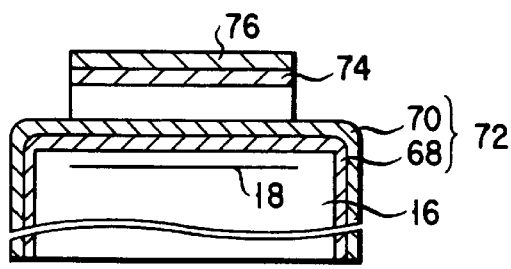

If necessary, a TiN film 76 is formed on the Ti film 74 as a metal-contained film, as is shown in FIG. 2G. The composite film 74, 76 can be used, for example, as a metallic barrier, or to form a wiring structure. The TiN film is formed on the wafer using the same film forming gases and under the same conditions as in the case of the formation of the TiN thin film 70 of the pre-coating laminated film 72. In other words, film formation is performed by plasmaless CVD, using $TiCl_4$ and $N_2$ gases as film forming gases.

After the pre-coating laminated film 72 is formed on the susceptor as described above, film formation is continuously performed on a predetermined number (e.g. about 12–25) of wafers. Since during a series of film formation, by-products such as a titanium compound is adhered to the inner wall of the process chamber 4 or elements contained therein, the interior of the chamber is cleaned after the film forming process of the predetermined number of wafers is finished.

The cleaning process is performed by flowing into the process chamber 4 a ClF-based gas, such as $ClF_3$, which is used as a cleaning gas, with the susceptor 16, the shower head 20 and the chamber walls kept at a predetermined temperature, thereby vaporizing and removing a titanium chloride adhered thereto. Since the pre-coating laminated film 72 is removed during the cleaning process, the susceptor is again coated with a pre-coating metal-contained thin film 72 in the above-described manner before a film is formed on the next wafer. Since thus, the susceptor is coated with the pre-coating metal-contained thin film 72 which contains the same metal as the film formed on the wafer, metal atoms from the susceptor 16 are prevented to out go into an atmosphere, thereby preventing heavy metal contamination due to a metal contained in the susceptor 16.

Moreover, since Ti metal contained in the pre-coating laminated film 72 is shifted to the wafer W during film formation on the wafer, the metal is identical to that to be deposited on the wafer, which means that no foreign heavy metal contamination will occur. In addition, the susceptor 16 is formed of a metallic material such as Hastelloy, and hence has an excellent conductivity. Accordingly, no potential difference will occur on the susceptor 16 or between the susceptor 16 and the peripheral wall of the chamber 4 during film formation using plasma. This means that variations in plasma concentration due to the potential difference can be suppressed, whereby the plasma concentration is unified and hence plasma is stabilized. Also, since the susceptor 16 is formed of a metal, it shows a higher thermal conductivity than a susceptor formed of ceramic.

Figure 3A:
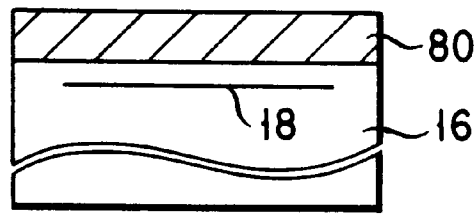
FIGS. 3A–3C are views, showing process steps useful in explaining a modification of the film forming method.
Figure 3B:
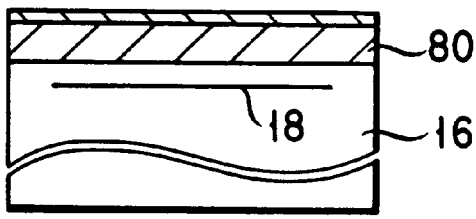
Figure 3C:
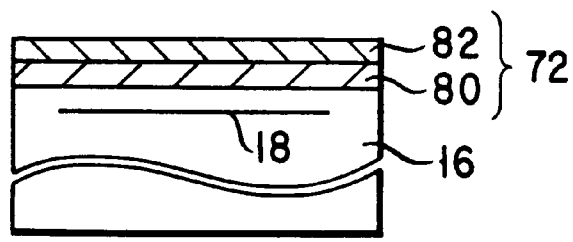

Although in the process steps shown in FIGS. 2A–2G, the pre-coating laminated film 72 is formed by forming the Ti thin film 68 as the first layer, and then the TiN thin film 70 as the second layer, the film 72 is not limited to this but may be formed as shown in FIGS. 3A–3C. Specifically, as shown in FIG. 3A, a Ti thin film 80 having a slightly thickness, for example, 300–500 Å is formed on the susceptor 16 in the same manner as the Ti thin film 68. Then, as is shown in FIG. 3B, a surface portion of the Ti thin film 80 is nitrified by flowing an $N_2$ gas into the process chamber 4 and at the same time generating plasma. As a result, as shown in FIG. 3C, the surface portion or an upper half portion of the Ti thin film 80 is nitrified, thereby forming a TiN thin film 82 as a second layer. Thus, a pre-coating metal-contained thin film 72 of a double-layer structure is formed on the susceptor 16.

Figure 4:
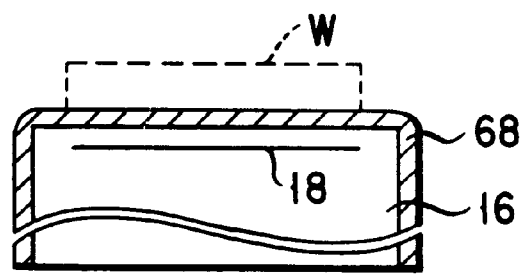
FIG. 4 is a view, showing a process step useful in explaining another modification of the film forming method.

Furthermore, although in the embodiments, the pre-coating metal-contained thin film 72 has a double-layer structure, the film is not limited to this but may have a single-layer structure as shown in FIG. 4, which includes either the Ti thin film 68 or the TiN thin film 70. The structure of the thin film 72 and the metal contained therein can be changed in various manners. It suffices if the film 72 contains the same metal as a film formed on a wafer.

Although in the embodiments, titanium is used as the metal contained in the film, the invention is not limited to this. It is a matter of course that other metals such as tungsten, molybdenum, aluminum, etc. can be used. The object to be processed is not limited to the semiconductor wafer, but may be a glass substrate, an LCD substrate, etc.

As described above, the film forming method and apparatus of the invention can provide an advantage stated below.

Since the metallic susceptor is coated with a pre-coating metal-contained thin film which contains the same metal as a metal-contained thin film to be formed on an object, metallic atoms in the susceptor are prevented by the pre-coating thin film from outgoing, thereby avoiding heavy metal contamination of the object. As a result, the susceptor which is free from heavy metal contamination can be formed of a highly conductive metallic material, whereby a potential difference which will adversely affect plasma distribution can be prevented, and a uniform and stable plasma distribution can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A film forming method comprising:
   a) a pre-process step of supplying a first pre-coating film forming gas containing titanium into a process chamber in which a susceptor for supporting a to-be-processed object is located, at the same time heating the susceptor to thereby form, on the susceptor exposed to the pre-coating film forming gas, a first titanium film;
   b) a take-in step of taking the to-be-processed object into the process chamber after the pre-process step (a), and directly mounting the object on a part of the first titanium film formed on the susceptor;
   c) a film forming step of supplying a film forming gas containing titanium into the process chamber, at the same time heating the susceptor to thereby form, on the object, a second titanium film; and
   d) a take-out step of taking, out of the process chamber, the object with the second titanium film formed thereon.

2. A film forming method according to claim 1, wherein the steps b) to d) are repeated several times, and further comprising a step of cleaning the process chamber and the susceptor by supplying a cleaning gas into the process chamber after the repetition of the steps b) to d).

* * * * *